United States Patent

Mize

[15] 3,691,406

[45] Sept. 12, 1972

[54] SURFACE ACOUSTIC WAVE GENERATING SYSTEM

[72] Inventor: Jack P. Mize, Richardson, Tex. 75080

[73] Assignee: Texas Instruments Incorporated, Dallas, Tex.

[22] Filed: Aug. 13, 1971

[21] Appl. No.: 171,678

[52] U.S. Cl. ......................307/308, 307/303, 310/8, 317/235 UA, 317/235 B, 317/235 G, 317/235 M, 333/72

[51] Int. Cl. ..............................................H03k 3/26

[58] Field of Search..............307/308, 293, 299, 303; 317/235 UA, 235 B, 235 G, 235 M; 333/30 R, 72; 310/8, 8.1, 8.2, 9.1–9.8

[56] References Cited

UNITED STATES PATENTS

| | | | |
|---|---|---|---|
| 3,360,749 | 12/1967 | Sittig | 333/30 |
| 3,414,779 | 12/1968 | Bohm | 317/235 M |
| 3,473,046 | 10/1969 | Wonson | 307/308 |
| 3,609,252 | 9/1971 | McKinney et al. | 317/235 B |

OTHER PUBLICATIONS

" Detection of Piezoelectric Surface Acoustic Waves" IN IBM Tech. Disclosure Bulletin, Vol. 12, No. 5, October 1969, pages 638- 639

" Mosfet Ultrasonic Surfacewave Detectors for Programmable Matched Filters" by Claiborne et al. in Applied Physics Letters, Vol. 19, No. 3, August 1971, pages 58- 60,

*Primary Examiner*—Stanley D. Miller, Jr.
*Attorney*—Harold Levine et al.

[57] ABSTRACT

In a surface acoustic wave generating system, a portion of a body of semiconductor material is incorporated in structure having electrical capacitance. The capacitive structure is energized to produce mechanical stress in the body of semiconductor material and thereby generate surface acoustic waves on a surface of the body of semiconductor material. In one embodiment of the invention the capacitive structure comprises one or more *p–n* junctions formed in the body of semiconductor material and intersecting the surface. In another embodiment the capacitive structure comprises one or more MOS capacitors disposed on the body of semiconductor material.

25 Claims, 7 Drawing Figures

INVENTOR
JACK P. MIZE

INVENTOR

JACK P. MIZE

SURFACE ACOUSTIC WAVE GENERATING SYSTEM

This invention relates to a system for generating surface acoustic waves, and more generally to a method of and apparatus for processing electrical signals by means of surface acoustic waves.

It is now well established that surface acoustic waves on silicon and similar semiconductor materials may be detected by means of arrays of metal-oxide-silicon field effect transistor MOSFET detectors or other insulated gate field effect transistor (IGFET) detectors. Systems incorporating surface acoustic wave generation and detection have been found to be useful in the communications industry as a means of signal decoding, signal compression, etc. A very important prospective use for surface acoustic wave systems is in tuning systems for television receivers.

Heretofore two techniques have been utilized in generating surface acoustic waves on semiconductor surfaces. In accordance with the most widely known technique, a glass body of triangular cross-section is bonded to a surface of a body of semiconductor material. A suitable piezoelectric device, for example, a lithium niobate crystal, is in turn mounted on one side of the body of glass. When the piezoelectric device is actuated, a bulk wave is generated within the body of glass. If the angular relationship between the side of the body of glass which supports the piezoelectric device and the surface of the body of semiconductor material is appropriate, the body of glass translates the bulk wave into a surface acoustic wave on the surface of the body of semiconductor material.

In accordance with another technique, a piezoelectric crystal is bonded directly to a surface of a body of semiconductor material. When the piezoelectric crystal is actuated, a bulk wave is established within the material. A certain portion of the bulk wave is translated into a surface acoustic wave by the semiconductor material.

Both of the foregoing techniques for generating surface acoustic waves are unsatisfactory for a number of reasons. Most importantly, such techniques are very inefficient insofar as the conversion of the electrical energy to mechanical stress is concerned. Also, both techniques are incompatible with the processes that are commonly employed in the fabrication of semiconductor devices, MOSFET devices, and the like. This greatly increases both the cost and the complexity of manufacturing signal processing systems incorporating surface acoustic wave generating apparatus.

The present invention comprises apparatus for generating surface acoustic waves which overcomes the foregoing and other disadvantages that are characteristic of the prior art. In accordance with the preferred embodiment of the invention, a portion of a body of semiconductor material is incorporated in structure having electrical capacitance. When the capacitive structure is actuated with voltage, mechanical stress is induced in the body of semiconductor material. The generated stress is developed by electrostatic forces between the effective plates of the capacitive structure and functions to produce a surface acoustic wave on a surface of the body of semiconductor material.

A more complete understanding of the invention may be had by referring to the following detailed description when taken in conjunction with the accompanying drawings, wherein.

Figure 1:
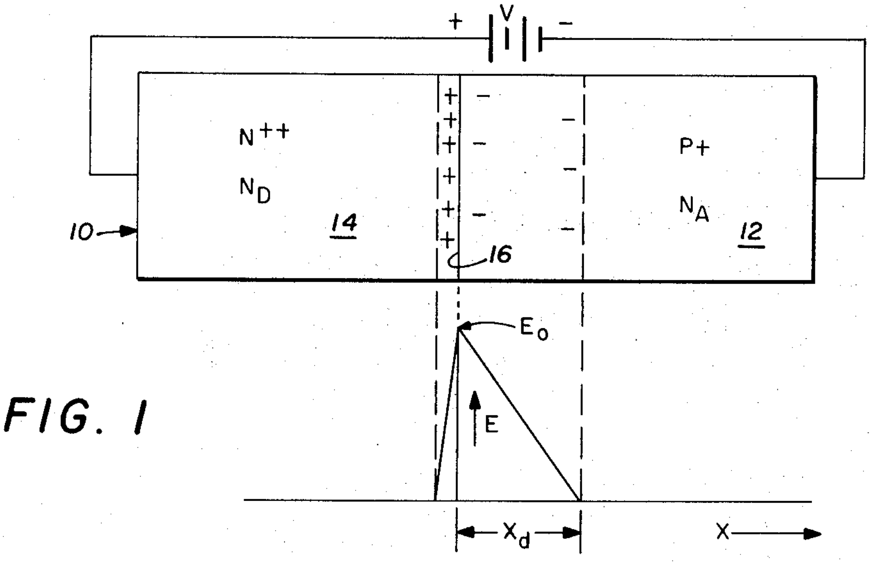
FIG. 1 is a schematic illustration of the actuation of an *n–p* junction to produce mechanical stress.

Referring now to the drawings, and particularly to FIG. 1, there is shown a body of semiconductor material 10 including a region of $p^+$ type semiconductor material 12 and a region of $n^{++}$ type semiconductor material 14 which are separated by a junction 16. As is well known in the art, a junction between different types of semiconductor material such as the junction 16 shown in FIG. 1 exhibits numerous characteristics which are analogous to a parallel plate type of capacitor. These include capacitance, equal and opposite charge on opposite sides of the junction, electric field in the space charge region, and mechanical stress between the opposite sides of the junction.

The magnitude of the stress between the opposite sides of the junction may be calculated. Recall that for a "one-sided" step junction, the E field distribution shown in FIG. 1 has a maximum value given by $$E_o = \sigma_{ND}/\epsilon_{Si}\epsilon_o) \quad (1)$$

where $\sigma_{ND}$ is the space charge density (per unit area) on the *n* side of the junction, $\epsilon_{Si}$ is the dielectric constant of silicone, and $\epsilon_o$ is the permittivity of free space. From the condition of overall charge neutrality of the system $$\sigma_{ND} = \sigma_{NA} \quad (2)$$

where $\sigma_{NA}$ is the space charge density (per unit area) on the *p* side of the junction. The elemental stress, $\Delta S$, developed by the oppositely charged regions is:

$$\Delta S = [\text{Electrical Field}] \cdot [\text{Sheet Charge Density}]$$

and the total stress, S, is:

$$S = \Sigma[E(x)] \cdot \left[\frac{\sigma_{NA}}{x_d}\Delta x\right]$$

i.e.

$$S = \int_0^{x_d} E(x)\frac{\sigma_{NA}}{x_d}dx$$

where on the *p* side of the junction $$E(x) = E_o - \frac{E_o x}{x_d}$$

so $$S=\int_0^{x_d}\left(E_o-\frac{E_o x}{x_d}\right)\cdot\left(\frac{\sigma_{NA}}{x_d}\right)dx$$

and from Equation (1)

$$S=\int_0^{x_d}\frac{\sigma_{ND}}{\epsilon_{Si}\epsilon_o}\left(1-\frac{x}{x_d}\right)\cdot\left(\frac{\sigma_{NA}}{x_d}\right)dx$$

and from Equation (2)

$$S=\int_0^{x_d}\frac{\sigma_{ND}^2}{x_d\epsilon_{Si}\epsilon_o}\left(1-\frac{x}{x_d}\right)dx$$

$$S=\frac{\sigma_{ND}^2}{x_d\epsilon_{Si}\epsilon_o}\left(x-\frac{x^2}{2x_d}\right)\Bigg|_0^{x_d}$$

$$S=\frac{\sigma_{ND}^2}{x_d\epsilon_{Si}\epsilon_o}\left(x_d-\frac{x_d^2}{2x_d}\right)$$

and $$S=\sigma_{ND}^2/(2\epsilon_{Si}\epsilon_o) \qquad (3)$$

Equation (3) is the expression for the stress (force per unit area) present in a one-sided step *p–n* junction.

Numerical values of the stress generated in a reverse biased *p–n* junction for a given applied voltage and dopant concentration can also be calculated. Since induced stress in a reversed bias *p–n* junction is proportional to $\sigma_{ND}^2$, Equation (3), it is clear that for a given applied voltage, heavily doped *p–n* junction experience greater interface stress than is the case in lightly doped junctions. The following calculations will therefore be based on a one-sided step $p^+ -n^{++}$ junction with the $n^{++}$ side assumed to be infinitely doped and the $p^{++}$ doping level assumed to be $10^{18}/cm^3$.

With a 5 volt reverse bias applied to the junction, a value of $\sigma_{NA}$ can be calculated by considering that since $$C=dQ/dV;$$

and since the capacitance of the junction is given by:

$$C=(\epsilon_{Si}\epsilon_o)/x_d, \qquad (4)$$

therefore $$dQ=CdV=\epsilon_{Si}\epsilon_o/x_d\,dV \qquad (5)$$

Recalling that $x_d$ is given by $$x_d=\sqrt{\frac{2\epsilon_{Si}\epsilon_o V}{qN_A}} \qquad (6)$$

if built-in junction potential is neglected, therefore:

$$\sigma_{NA}=\sigma_{ND}=Q=\int_0^V CdV \qquad (7)$$

Thus from Equations (4), (5), (6) and (7):

$$\sigma_{ND}=\int_0^V\frac{\epsilon_{Si}\epsilon_o}{\sqrt{\frac{2\epsilon_{Si}\epsilon_o V}{qN_A}}}dV$$

$$\sigma_{ND}=\sqrt{\frac{qN_A\epsilon_{Si}\epsilon_o}{2}}\int_0^{5\text{ volts}}V^{-1/2}\,dV$$

$$\sigma_{ND}=2\sqrt{\frac{qN_A\epsilon_{Si}\epsilon_o}{2}}V^{1/2}\Big|_0^{5\text{ volts}}$$

$$\sigma_{ND}=\sqrt{2qN_A\epsilon_{Si}\epsilon_o}\cdot\sqrt{5}$$

and for $$N_A=10^{18}/\text{cm.}^3$$

$$\sigma_{ND}=\sqrt{(10)(1.6\cdot10^{-19})(10^{18})(12)(8.85\cdot10^{-14})}$$

i.e.

$$\sigma_{ND}=13\cdot10^{-7}\text{ coulombs/cm.}^2$$

Therefore from Equation (3)

$$S=\frac{\sigma_{ND}^2}{2\epsilon_{Si}\epsilon_o}=\frac{(13\cdot10^{-7})^2}{(2)(12)(8.85\cdot10^{-14})}=0.8\text{ Newton/cm.}^2$$

$$S=0.8\cdot10^5\text{ dynes/cm.}^2$$

Figures 2, 3:
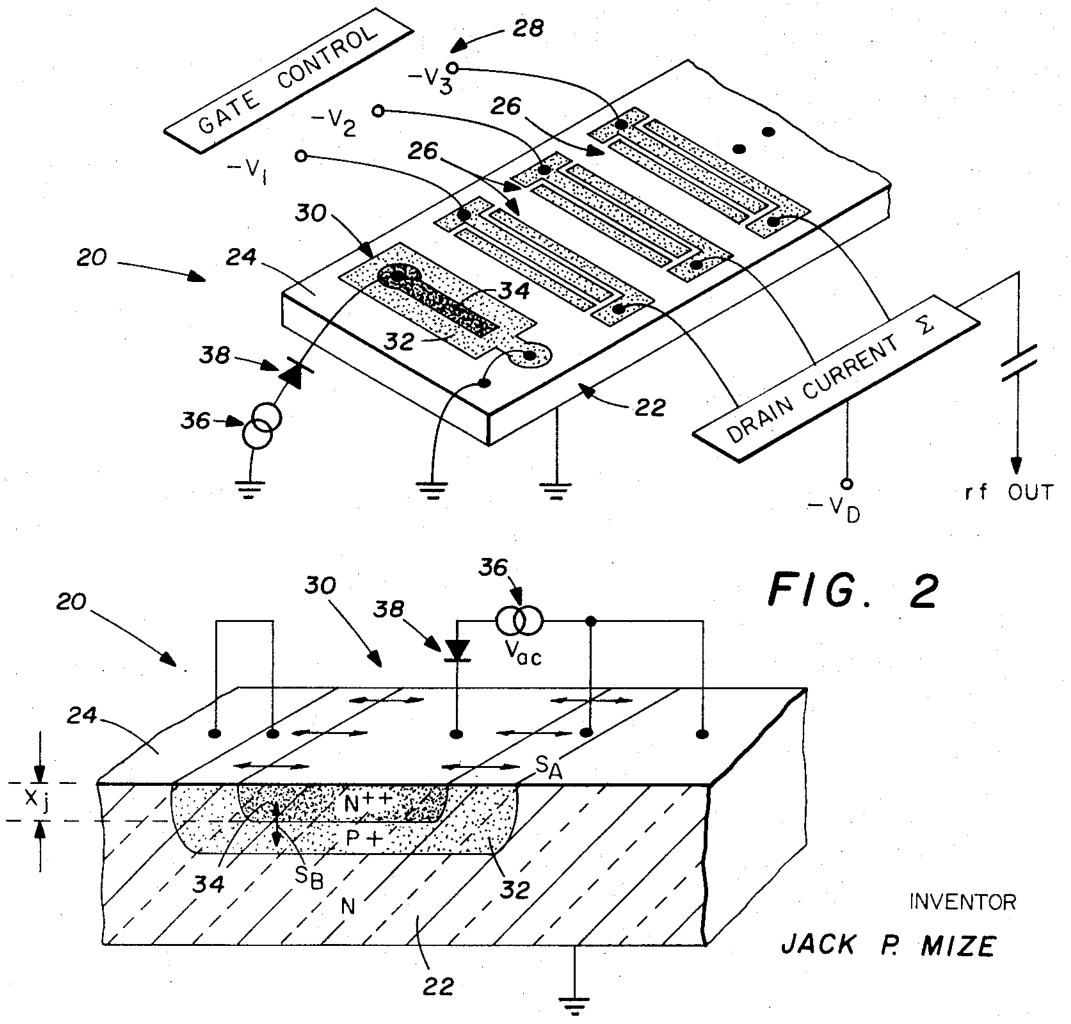
FIG. 2 is a perspective view of a signal processing system incorporating the preferred embodiment of the invention.
FIG. 3 is a sectional view taken through a portion of the system shown in FIG. 2.

Referring now to FIG. 2, there is shown a signal processing system 20 which utilizes the foregoing capacitive characteristics of a reverse biased $n^{++}-p^+$ junction to generate surface acoustic waves. The signal processing system 20 includes a body of *n* type silicon semiconductor material 22 having a surface 24. The system 20 further includes a plurality of MOSFET detectors 26 which are formed on the surface 24 by conventional techniques. The detectors 26 are actuated by conventional circuitry 28 to produce an output in response to surface acoustic waves on the surface 24. It will be understood that other types of IGFET detectors may be used in the signal processing system 20, if desired.

Surface acoustic waves are generated in the signal processing system 20 by means of a surface acoustic wave generating apparatus 30 constructed in accordance with the preferred embodiment of the present invention. As is best shown in FIG. 3, the surface acoustic wave generating apparatus 30 comprises a body of $p^+$ type semiconductor material 32 which is formed in the body of semiconductor material 22 by conventional techniques and a body of $n^{++}$ type semiconductor material 34 which is formed in the body of $p^+$ type semiconductor material 32 also by conventional techniques. The surface acoustic wave generating apparatus 30 is actuated by a signal generator 36 which is coupled across the junction between the body of $p^+$ type semiconductor material 32 and the body of $n^{++}$ type semiconductor material 34. The apparatus 30 is preferably equipped with a diode 38 to prevent forward biasing of the junction, and the body of $p^+$ type semiconductor material 32 is preferably shorted to the main portion of the body of *n* type silicon 32 to prevent transistor action.

Referring again to FIG. 2, the signal generator 36 is employed to energize the surface acoustic wave generating apparatus 30 in accordance with a particular time varying electric signal. That is, the signal generator establishes a capacitive charge between the body of $p^+$ type semiconductor material 32 and the body of $n^{++}$ type semiconductor material 34. As is demonstrated by the foregoing mathematical formulas, such action induces mechanical stress in the body of semiconductor material 22. This stress is in the directions of the arrows $S_A$ and $S_B$ and functions to generate a surface acoustic wave on the surface 24 of the body of semiconductor material 22. The wave is detected by the MOSFET detectors 26 to produce an output. By this means, various functions can be performed, such as the decoding of Barker coded sequences, signal compression, etc.

Figure 4:
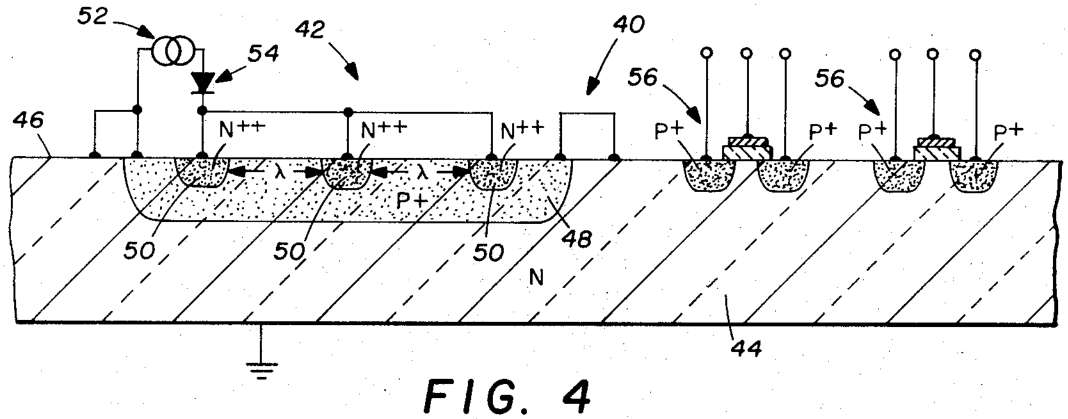
FIG. 4 is a sectional view illustrating a second signal processing system incorporating the preferred embodiment of the invention.

Referring now to FIG. 4, there is shown a signal processing system 40 incorporating a surface acoustic wave generating apparatus 42 which may be utilized to generate surface acoustic waves of greater amplitude than is possible with the surface acoustic wave generating apparatus 30 of the signal processing system 20. The signal processing system 40 includes a body of $n$ type silicon semiconductor material 44 having a surface 46. The surface acoustic wave generating apparatus 42 comprises a body of $p^+$ type semiconductor material 48 which is formed in the body of semiconductor material 44 by conventional techniques. A plurality of bodies of $n^{++}$ type semiconductor material 50 are in turn formed in the body of $p^+$ type semiconductor material 48 by conventional techniques.

The bodies 50 are separated by a distance λ which is either equal to or is equal to some predetermined fraction of the wave length of the surface acoustic waves that are to be generated on the surface 46 of the body of semiconductor material 44. The surface acoustic wave generating apparatus 42 is actuated by a signal generator 52 and a diode 54 is provided to prevent forward biasing of the junctions between the body of $p^+$ type semiconductor material 48 and the bodies of $n^{++}$ type semiconductor material 50. The junction between the body of $p^+$ type semiconductor material 48 and the remainder of the body of semiconductor material 44 is preferably shorted to prevent transistor action.

The signal processing system 40 further includes a plurality of MOSFET detectors 56 which are formed on the surface 46 of the body of semiconductor material 44 by conventional techniques. Upon actuation of the signal generator 52, mechanical stress is established in the body of semiconductor material 44 due to electrostatic forces between the effective plates of the capacitive structure, i.e., between the bodies of $n^{++}$ type semiconductor material 50 and the body of $p^+$ type semiconductor material 48. This produces surface acoustic waves on the surface 46 of the body of semiconductor material 44 which are detected by the MOSFET detectors 56. By proper positioning of the $n^{++}-p^+$ junctions in the surface acoustic wave generating apparatus 42, the surface acoustic waves produced are caused to add together and therefore have greater amplitude than would otherwise be the case. The outputs of the detectors 56 in response to the surface acoustic waves are processed and utilized by conventional techniques.

The efficiency of a surface acoustic wave generating apparatus may be characterized by the ratio of the amplitude of the surface acoustic waves that are produced by the apparatus on a surface of a body of semiconductor material (i.e., waves produced by stress in the direction of the arrows $S_A$ of FIG. 3) to the amplitude of the bulk waves that are produced by the apparatus in the interior of the body of semiconductor material (i.e., waves produced by stress in the direction of the arrows $S_B$ of FIG. 3). Both the surface acoustic wave generating apparatus 30 and the surface acoustic wave generating apparatus 42 are characterized by $n^{++}-p^+$ junctions which extend a substantial distance in the direction of the surfaces 24 and 46, respectively. This causes a surface acoustic wave generating apparatus of the type shown in FIGS. 2 and 4 to produce a rather large proportion of bulk waves.

Figure 5:
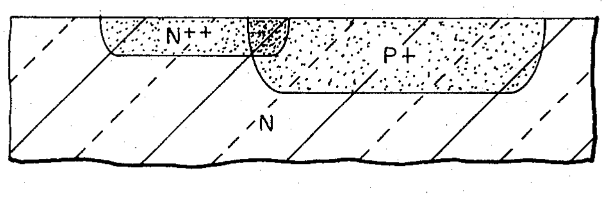
FIG. 5 is a sectional view of a particular *n–p* junction which is useful in the practice of the invention.

The efficiency of a surface acoustic wave generating apparatus may be increased by the use of an $n^{++}-p^+$ junction of the type shown in FIG. 5. Such a junction has only a small portion of its area extending parallel to the relevant surface, so that when a capacitive charge is established across the junction to produce mechanical stress in a body of semiconductor material, the ratio of the amplitude of the surface waves that are produced on the surface to the amplitude of bulk waves that are produced in the interior of the body of semiconductor material is relatively large. Junctions of the type shown in FIG. 5 also exhibit a relatively large high frequency impedance which is highly desirable in signal processing systems of the type shown in FIGS. 2 and 4.

Figure 6:
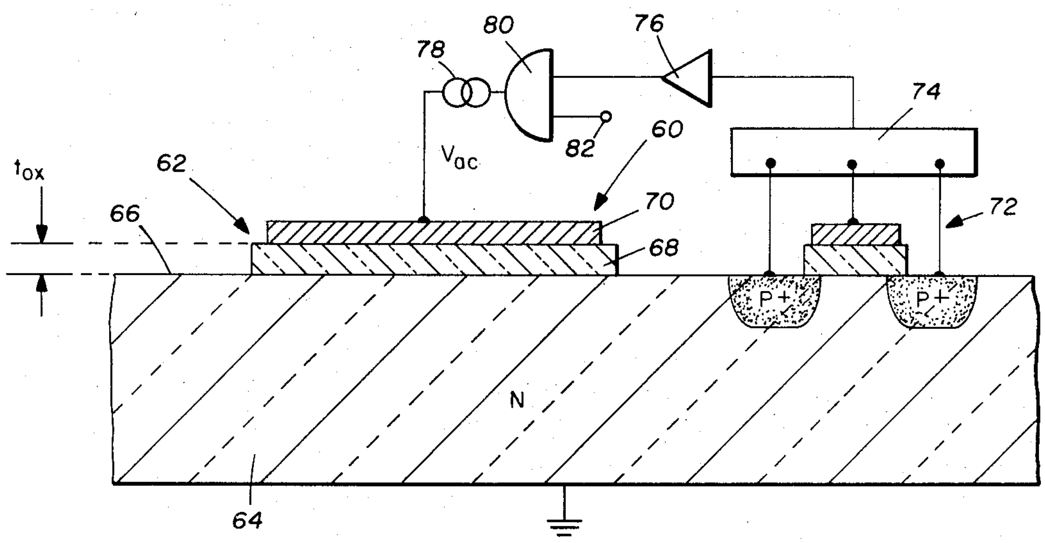
FIG. 6 is a sectional view of a signal processing system incorporating an alternative embodiment of the invention.

Referring now to FIG. 6, there is shown a signal processing system 60 incorporating a surface acoustic wave generating apparatus 62 comprising an alternative embodiment of the present invention. The signal processing system 60 includes a body of n type silicon semiconductor material 64 having a surface 66. The signal generating apparatus 62 comprises a MOS capacitor and includes a layer of silicon dioxide ($SiO_2$) 68 formed on the surface 66 of the body of silicon semiconductor material 64 and a metal layer 70 formed on the silicon dioxide layer 68. The layers 68 and 70 of the surface acoustic wave generating apparatus 62 are preferably formed by conventional fabrication techniques. Of course, insulative layers comprising materials other than silicon dioxide may be used in the signal generating apparatus 62.

The surface acoustic wave generating apparatus 62 is actuated by energizing the metal layer 70 with a stepped voltage pulse. The stress produced in the body of semiconductor material 64 under such action may be calculated as follows. Assuming that $$t_{ox} = 10^{-5}\text{cm, then}$$

$$C = \epsilon_{ox}\epsilon_o/t_{ox} = (4)(8.85\cdot 10^{-14}) = 36\cdot 10^{-9}\ \text{farads/cm}^2$$

and if $$V = 50\ \text{volts,}$$

$$Q = CV = (36\cdot 10^{-9})\,(50) = 1.8\cdot 10^{-6}\ \text{coulombs/cm}^2$$

then, $$S = \frac{\sigma^2}{2\epsilon_{ox}\epsilon_o} = \frac{(1.8\cdot 10^{-6})^2}{(2)\,(4)\,(8.85\cdot 10^{-14})} = 4.5\ \text{Newtons/cm.}^2$$

Therefore $$S \cong 4.5\cdot 10^5\ \text{dynes/cm}^2\ {}^{n+p+}$$

The signal processing system 60 further includes a MOSFET detector 72 which is formed on the surface 66 of the body of silicon semiconductor material 64 by conventional techniques. Upon actuation of the surface acoustic wave generating apparatus 62, mechanical stress is produced in the body of semiconductor material 64 due to energization of the metal layer 70 and the resulting capacitive effect. This stress produces bulk waves in the body of semiconductor material. A certain percentage of the bulk waves are transformed into surface acoustic waves. The surface acoustic waves are detected by the MOSFET detector 72 and may thereupon be utilized by conventional techniques.

FIG. 6 also illustrates a particular application of the present invention in signal processing. The outputs of the MOSFET detector 72 are processed by conventional circuitry 74 and are then fed to a feedback amplifier 76. The feedback amplifier 76 is coupled to a signal generator 78 through an OR-gate 80. Thus, any signal applied to an input terminal 82 of the OR-gate 80 is applied to the surface acoustic wave generating apparatus 62 by the signal generator 78 and is thereupon converted to a surface acoustic wave on the surface 66 of the body of semiconductor material 64. The surface acoustic wave is detected and converted to an electrical output by the MOSFET detector 72 and is fed back to the signal generator 78 through the circuitry 74, the feedback amplifier 76 and the OR-gate 80. The signal is thus continuously regenerated in the signal processing apparatus 60 so that the signal processing apparatus 60 comprises a memory which may be used to store a given signal as long as necessary. It will be appreciated that the same circuit elements 74, 76 and 80 can be employed in conjunction with the signal processing system 20 shown in FIG. 2 or in conjunction with the signal processing system 40 shown in FIG. 4 to provide a surface acoustic wave memory incorporating an $h^{+++}$ – junction type signal generating apparatus. Also, the same electronic configuration can be employed as a shift register with recirculate control.

Figure 7:
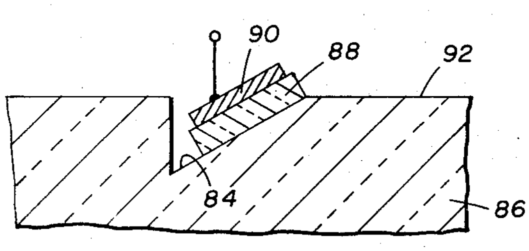
FIG. 7 is a sectional view illustrating another surface acoustic wave generating apparatus incorporating the alternative embodiment of the invention.

One difficulty that may be encountered in the use of a surface acoustic wave generating apparatus of the type illustrated in FIG. 6 is that the apparatus produces a rather low surface acoustic wave to bulk wave ratio. This deficiency may be at least partially overcome by orienting the apparatus in the manner shown in FIG. 7. By this technique a sloping surface 84 is formed in the body of semiconductor material 86 by orientation dependent etching. A layer of silicon dioxide 88 is formed on the surface 84 and a metallic layer 90 is formed on the layer 88 both by conventional MOSFET fabrication techniques. The system is energized by applying a stepped voltage pulse to the metallic layer 90. Due to the capacitive structure between the layer 90 and the body of semiconductor material 86, the body of semiconductor material is mechanically stressed, whereby waves are produced in the material. However, due to the orientation of the layers 88 and 90 relative to a surface 92 of the material 86, the ratio of the amplitude of the surface acoustic waves generated on the surface 92 to the amplitude of the bulk waves generated on the interior of the body of semiconductor material 86 is markedly increased over a similar ratio calculated for the arrangement illustrated in FIG. 6.

Those skilled in the art will appreciate the fact that numerous modifications to the structure shown in the drawings are possible in the practice of the present invention. For example, a body of semiconductor material having one or more *p–n* junctions formed in it could be bonded to a surface for actuation to generate surface acoustic waves on the surface. Also, the *p–n* junction could be a $p^{++}-n^{+}$ junction as well as an $n^{++}-p^{+}$ junction and the body of semiconductor material could be a p-type material as well as an *n*-type material. Other modifications will immediately suggest themselves to those skilled in the art.

From the foregoing, it will be understood that in accordance with the present invention a portion of a body of semiconductor material is incorporated in structure having electrical capacitance. Upon energization of the capacitive structure with voltage, an electrostatic force is established between the effective capacitive plates whereby mechanical stress is induced in the body of semiconductor material. The mechanical stress in turn produces surface acoustic waves on a surface of the body of semiconductor material. The use of the invention is highly advantageous over the prior art in that the component parts of a surface acoustic wave generating apparatus incorporating the invention may be fabricated by conventional techniques of the type utilized to make semiconductor devices, MOSFET devices, and the like. This both simplifies and reduces the cost of producing signal processing systems incorporating surface acoustic wave generating apparatus.

Although preferred embodiments of the invention have been illustrated in the drawings and described in the foregoing specification, it will be understood that the invention is not limited to the embodiments disclosed, but is capable of rearrangement, modification, and substitution of parts and elements without departing from the spirit of the invention.

It is to be understood that the invention includes all manner of stresses induced in P–N junctions or MOS configurations which result in surface wave generation. These stresses can arise not only from Columbic forces but also from electrostrictive forces and other known electronic effects on elastic constants which serve to alter the deformation potential of semiconductors.

What is claimed is:

1. A method of generating surface acoustic waves on a surface of a body of semiconductor material comprising applying a time varying signal to structure having electrical capacitance to produce mechanical stress in the body of semiconductor material and thereby generate surface acoustic waves on the surface of the body of semiconductor material.

2. The method of generating surface acoustic waves according to claim 1 wherein the time varying signal is applied across a *p–n* junction.

3. The method of generating surface acoustic waves according to claim 2 wherein the *p–n* junction is formed in the body of semiconductor material and intersects the surface thereof.

4. The method of generating surface acoustic waves according to claim 2 further characterized by applying the time varying signal to a plurality of *p–n* junctions each separated by a distance equal to a predetermined function of the wave length of the surface acoustic waves.

5. The method of generating surface acoustic w aves according to claim 1 w herein the time varying signal is applied to a metal-insulator-semiconductor capacitor disposed on the body of semiconductor material.

6. The method of generating surface acoustic waves according to claim 1 further characterized by detecting the surface acoustic w aves generated on the surface of the body of semiconductor material and producing an output signal corresponding to the surface acoustic w aves.

7. The method of generating surface acoustic w aves according to claim 6 further characterized by reapplying the output signal to the structure having electrical capacitance.

8. A method of signal processing w hich comprises:

creating capacitive charge in a portion of a body of semiconductor material to produce mechanical stress in the body of semiconductor material and thereby generate surface acoustic waves on a surface of the body of semiconductor material; and detecting the surface acoustic waves.

9. The method of claim 8 wherein the capacitive charge is produced in the body of semiconductor material across at least one *p–n* junction disposed in the surface of the body of semiconductor material.

10. The method of claim 8 wherein the capacitive charge is applied to a metal-insulator-semiconductor capacitor disposed on the body of semiconductor material.

11. The method of claim 8 wherein the detecting step is carried out by means of at least one IGFET detector disposed on the surface of the body of semiconductor material.

12. A system for processing surface acoustic waves which comprises:

a body of semiconductor material;

electrically capacitive means including a portion of the body of semiconductor material;

means for energizing the electrically capacitive means to produce mechanical stress in the body of semiconductor material and thereby establish a surface acoustic wave on a surface of the body of semiconductor material; and means mounted on the surface of the body of semiconductor material for detecting the surface acoustic wave.

13. The surface acoustic wave processing system according to claim 12 wherein the electrically capacitive means includes a *p–n* junction formed in the body of semiconductor material.

14. The surface acoustic wave processing system according to claim 13 wherein the electrically capacitive means is further characterized by a plurality of *p–n* junctions formed in the body of semiconductor material and separated from one another by a distance comprising a predetermined function of the wave length of the surface acoustic wave.

15. The surface acoustic wave processing system according to claim 12 wherein the electrically capacitive means includes a layer of insulative material formed on a portion of the body of semiconductor material and a layer of metal formed on the layer of insulative material.

16. The surface acoustic wave processing system according to claim 12 wherein the means for energizing the electrically capacitive means includes means responsive to the surface acoustic wave detecting means for re-energizing the electrically capacitive means.

17. The surface acoustic wave processing system according to claim 12 wherein the surface acoustic wave detecting means comprises at least one IGFET detector disposed on the surface of the body of semiconductor material.

18. Apparatus for generating surface acoustic waves which comprises:

a body of semiconductor material having *p* type and *n* type regions therein which intersect at a junction; and means for back-biasing the junction between the *p* type and *n* type regions of the body of semiconductor material with a voltage pulse of predetermined magnitude to produce mechanical stress in the body of semiconductor material and thereby generate a surface acoustic wave on a surface of the body of semiconductor material.

19. The apparatus for generating surface acoustic waves according to claim 18 wherein the junction between the *p* type and *n* type regions in the body of semiconductor material extends perpendicularly to and intersects the surface of the body of semiconductor material.

20. The apparatus for generating surface acoustic waves according to claim 19 wherein one of the regions in the body of semiconductor material is substantially infinitely doped.

21. The apparatus for generating surface acoustic waves according to claim 20 further characterized by means mounted on the surface of the body of semiconductor material for detecting surface acoustic waves generated thereon.

22. The apparatus for generating surface acoustic waves according to claim 18 further characterized by a plurality of junctions between *p* type and *n* type regions formed in the body of semiconductor material at points separated by a distance equal to a predetermined function of the wave length of the surface acoustic wave.

23. Apparatus for generating surface acoustic waves comprising:

a body of semiconductor material;

a layer of insulative material formed on a portion of the body of semiconductor material;

a metal layer formed on the insulative layer; and means for establishing a capacitive charge between the metal layer and the body of semiconductor material to produce a mechanical stress in the body of the semiconductor material and thereby generate a surface acoustic wave on a surface of the body of semiconductor material.

24. The apparatus for generating surface acoustic waves according to claim 23 further characterized by means mounted on the surface of the body of semiconductor material for detecting the surface acoustic waves generated thereon.

25. The apparatus for generating surface acoustic waves according to claim 24 further including means responsive to the surface acoustic wave detecting means for re-actuating the capacitive charge establishing means.

* * * * *